United States Patent
Leu et al.

(10) Patent No.: US 6,605,549 B2
(45) Date of Patent: Aug. 12, 2003

(54) METHOD FOR IMPROVING NUCLEATION AND ADHESION OF CVD AND ALD FILMS DEPOSITED ONTO LOW-DIELECTRIC-CONSTANT DIELECTRICS

(75) Inventors: Jihperng Leu, Portland, OR (US); Chih-I Wu, Hillsboro, OR (US); Ying Zhou, Tigard, OR (US); Grant M. Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,212

(22) Filed: Sep. 29, 2001

(65) Prior Publication Data

US 2003/0064607 A1 Apr. 3, 2003

(51) Int. Cl.⁷ .................. H01L 21/31; H01L 21/469; H01L 21/26; H01L 21/42
(52) U.S. Cl. .................. 438/758; 438/778; 438/780; 438/795
(58) Field of Search .................. 438/758, 778, 438/780, 787, 795

(56) References Cited

U.S. PATENT DOCUMENTS

| | | |
|---|---|---|
| 5,869,149 A | 2/1999 | Denison et al. |
| 6,022,815 A | 2/2000 | Doyle et al. |
| 6,043,551 A | 3/2000 | Seshan |
| 6,051,869 A | 4/2000 | Pan et al. |
| 6,054,376 A | 4/2000 | Balakrishnan |
| 6,054,379 A | 4/2000 | Yau et al. |
| 6,080,526 A | 6/2000 | Yang et al. |
| 6,080,529 A | 6/2000 | Ye et al. |
| 6,097,095 A | 8/2000 | Chung |
| 6,121,159 A | 9/2000 | Pasch |
| 6,133,163 A | 10/2000 | Tanaka et al. |
| 6,143,647 A | 11/2000 | Pan et al. |
| 6,143,659 A | 11/2000 | Leem |
| 6,153,512 A * | 11/2000 | Chang et al. ............... 438/624 |
| 6,174,377 B1 | 1/2001 | Doering et al. |
| 6,187,660 B1 | 2/2001 | Gardner |
| 6,204,201 B1 | 3/2001 | Ross |
| 6,204,204 B1 | 3/2001 | Paranjpe et al. |
| 6,218,317 B1 | 4/2001 | Allada et al. |
| 6,221,440 B1 | 4/2001 | Meyer et al. |
| 6,226,171 B1 | 5/2001 | Beilin et al. |
| 6,242,339 B1 | 6/2001 | Aoi |
| 6,258,407 B1 | 7/2001 | Lee et al. |
| 6,265,243 B1 | 7/2001 | Katz et al. |
| 6,265,303 B1 | 7/2001 | Lu et al. |

FOREIGN PATENT DOCUMENTS

| | | |
|---|---|---|
| EP | 0678913 A1 | 10/1995 |
| EP | 0881678 A2 | 12/1998 |
| EP | 1077480 A1 | 2/2001 |

OTHER PUBLICATIONS

International Search Report PCT/US 02/30792.

* cited by examiner

Primary Examiner—Alexander Ghyka
(74) Attorney, Agent, or Firm—Blakely, Sokoloff, Taylor & Zafman LLP (57) ABSTRACT

A method to improve nucleation and/or adhesion of a CVD or ALD-deposited film/layer onto a low-dielectric constant (low-k) dielectric layer, such as a polymeric dielectric or a carbon-doped oxide. In an embodiment, the method includes providing a substrate into a deposition chamber. A dielectric layer having a reactive component is formed over the substrate. The formed dielectric layer having the reactive component is then processed to produce polar groups or polar sites at least on a surface of the formed dielectric layer. The present invention forms a low-k organic polymer dielectric layer or an organic-doped oxide dielectric layer having improved nucleation and/or adhesion properties for a subsequently deposited layer such as a barrier material layer.

16 Claims, 5 Drawing Sheets

METHOD FOR IMPROVING NUCLEATION AND ADHESION OF CVD AND ALD FILMS DEPOSITED ONTO LOW-DIELECTRIC-CONSTANT DIELECTRICS

BACKGROUND OF THE INVENTION

1. Field of the Invention

The present invention relates to integrated circuit manufacture and more particularly to a method to improve nucleation and adhesion of a film/layer deposited onto a low-dielectric constant (low-k) dielectric layer, a high-dielectric constant (high-k) gate dielectric layer, or a high-k capacitor dielectric layer.

2. Description of Related Art

In integrated circuit (IC) manufacturing, as metal pitch scales to 0.2 microns and below, physical vapor deposition (PVD) of a barrier material layer is no longer able to provide sufficient step coverage and alternative technologies must be employed. For these alternative technologies, which include chemical-vapor deposition (CVD) and atomic layer deposition (ALD), film/layer nucleation and/or adhesion onto a substrate is critical. This is especially essential for low-dielectric constant (low-k) polymeric dielectrics that have surface active sites typically below $1 \times 10^3$ atoms per square centimeter (atom/cm$^2$) compared to $1 \times 10^{14-15}$ atom/cm$^2$ in silicon oxide (SiO$_x$). Similar concerns apply to low-dielectric constant dielectrics, such as organic-containing silicon dioxide or carbon-doped oxide (CDO), whose wettability or sticking coefficient can be low due to Si—CH$_3$ surface.

One approach to improve CVD- and ALD-deposited film nucleation and/or adhesion onto low-k dielectrics includes selecting a material as dielectric substrate which may not have the desired dielectric constant performance. Another technique to improve CVD- or ALD-deposited film nucleation and/or adhesion onto low-k dielectrics is to use only certain types of materials for the film/layer, e.g. barrier layer, deposited which may limit the performance of the integrated circuit manufactured. Another approach for improving film nucleation and/or adhesion onto low-k dielectrics is using undesired process conditions, such as high temperatures, to process the substrate having the CVD film.

BRIEF DESCRIPTION OF THE DRAWINGS

The present invention is illustrated by way of example and not limitation in the accompanying figures of the accompanying drawings, in which like references indicate similar elements and in which.

DETAILED DESCRIPTION OF THE INVENTION

A method to improve nucleation and/or adhesion of a CVD or ALD-deposited film/layer onto a low-dielectric constant (low-k) dielectric layer, such as a polymeric dielectric or a carbon-doped oxide, is described. With this process, the low-k dielectric layer can be modified without affecting other integrated circuit manufacture processes such as etch and chemical mechanical polishing (CMP).

The present invention forms a low-k organic polymer dielectric layer or an organic-doped oxide dielectric layer having improved nucleation and/or adhesion properties for a subsequently deposited layer such as a barrier material layer. Si—OH or polar surface chemistry has been identified by inventors of method discussed therein as the critical parameter to enhance nucleation and/or adhesion of CVD or ALD-deposited barrier material layer(s) or other material layers onto low-k dielectrics, specifically carbon-doped oxide and polymeric dielectrics. This finding is supported by inventors' data showing good titanium nitride (TiN) nucleation and deposition onto silicon-containing poly (phenylene), which has 2–3 atom percent (at. %) Si in precursor solution matrix and SiO$_2$ with correlation to Si—OH content.

While the discussion included therein makes particular reference to a method for improving nucleation and adhesion of a CVD or ALD-deposited barrier film/layer onto a low-k dielectric material layer, the method of this invention is not so limited. As discussed below, the method of this invention is useful to other IC manufacture applications, including for example high-k gate dielectric layer deposition (e.g. aluminum oxide (Al$_2$O$_3$), tantalum pentoxide (Ta$_2$O$_5$), hafnium pentoxide (Hf$_2$O$_5$) material layers), and high-k capacitor dielectric layer deposition (e.g. Ta$_2$O$_5$, barium strontium titanate (BaSrTiO$_3$ or BST)) using CVD or ALD deposition techniques.

In the following detailed description, numerous specific details are set forth in order to provide a more thorough understanding of the present invention. However, it will be apparent to those skilled in the art to which this invention pertains that the present invention may be practiced without these specific details. In other instances, well-known devices, methods, procedures, and individual components have not been described in detail so as not to unnecessarily obscure aspects of the present invention.

Referring to the drawings, where like elements are designated by like reference numerals, embodiments of the present invention for improving nucleation and adhesion of a CVD or ALD-deposited film/layer, such as barrier layer, onto a low-k dielectric layer are illustrated by FIGS. 1 through 4.

Figure 1:
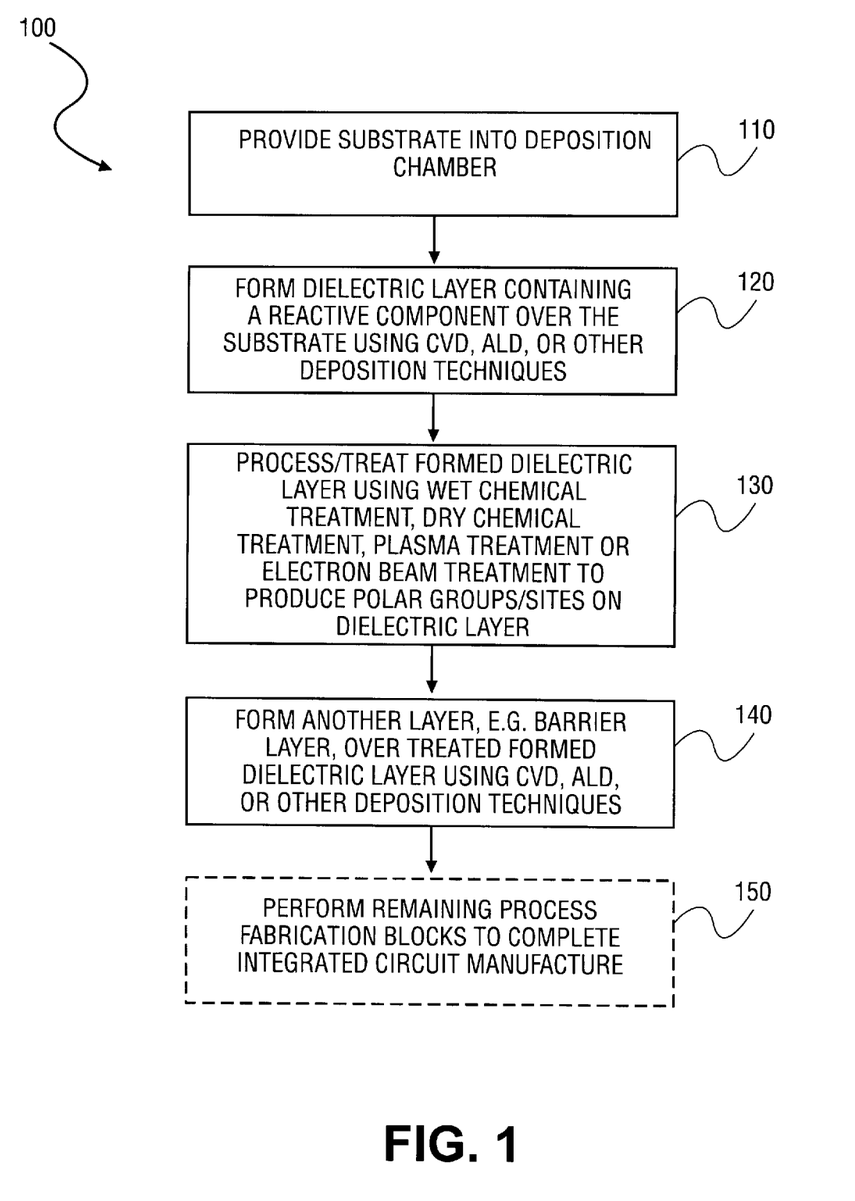
FIG. 1 represents generally the process according to this invention to improve nucleation and adhesion of a film/layer deposited onto dielectrics such as low-k dielectrics, high-k gate dielectrics, high-k capacitor dielectrics, etc.
Figure 2A:
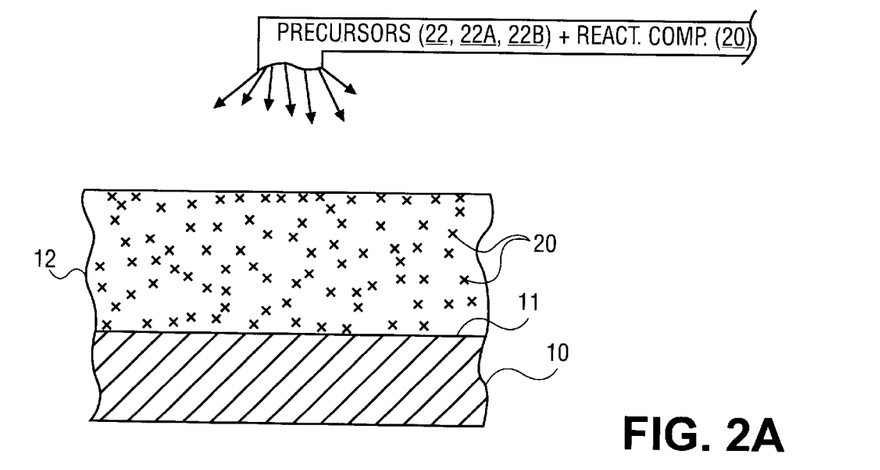
FIGS. 2a–2c are schematic cross-sectional views illustrating a substrate processed according to the process embodiment shown in FIG. 1.
Figure 2B:
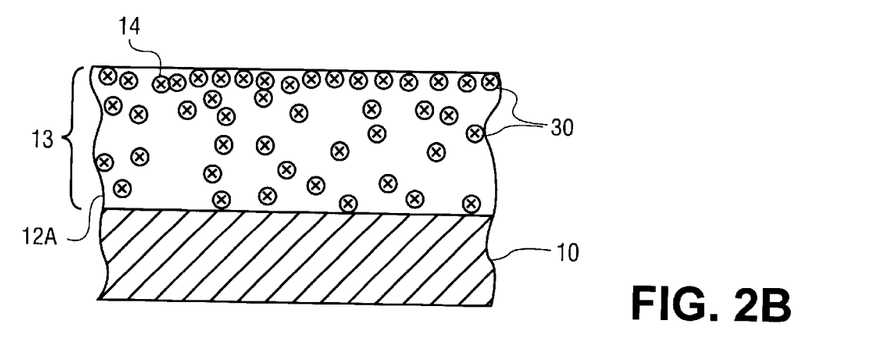
Figure 2C:
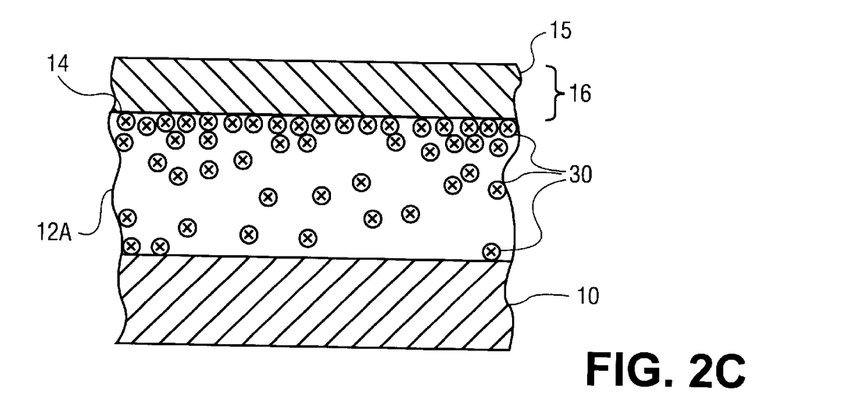

FIG. 1 represents generally the process according to this invention for improving nucleation and adhesion of a CVD or ALD-deposited film/layer on a low-k organic polymer dielectric layer, on an organic-doped silicon dioxide dielectric layer, or on other dielectric layers known in the art, for example high-k gate dielectric layers or DRAM capacitor dielectric layer. FIGS. 2a–2c are schematic cross-sectional views illustrating a substrate processed according to the process embodiment shown in FIG. 1.

With reference to FIGS. 1 and 2a, the method of this invention generally starts by providing a substrate 10 into a deposition chamber of a system typically used in integrated circuit (IC) manufacture (block 110 of process chart 100 of FIG. 1). Suitable substrate materials for the present invention include, but are not limited to, low-k dielectric materials such as low-k polymeric dielectrics or organic-containing silicon dioxide or carbon-doped oxide (CDO) dielectric. Other substrate materials, such as silicon and compositions containing silicon, and other substrate materials known in the art of IC manufacture are also within the scope of this invention. Substrate 10 may be bare or may have metallic lines, transistors or other circuitry already fabricated below the substrate/wafer surface 11 according to conventional IC fabrication techniques.

Continuing with reference to FIGS. 1 and 2a, with the substrate 10 in the deposition chamber, a dielectric layer 12 having a reactive component 20 therewith is formed over the substrate 10 (block 120 of chart 100 in FIG. 1). Reactive component 20 may include any component that produces or enhances the generation of polar groups or polar sites on the formed dielectric layer 12. In one embodiment, the reactive component 20 is added to a precursor solution 22 used in forming the dielectric layer 12. The precursor solution 22 with the reactive component 20 is then deposited over the substrate 10 using a chemical vapor deposition (CVD) process, an atomic vapor deposition (ALD) process or alike to form the dielectric layer 12. Alternatively, to minimize the impact on dielectric constant, instead of adding the reactive component 20 to the precursor solution 22 matrix, the reactive component 20 may be deposited onto the surface of the already formed dielectric layer 12. The thickness 13 of the dielectric film 12 formed on substrate 10 may vary depending on the type of integrated circuit (IC) being manufactured, processing preferences, etc., but typically the thickness 13 may range from about 500 angstroms (Å) to about 50,000 Å and preferably about 2,000–20,000 Å.

In one embodiment, dielectric layer 12 is formed over substrate 10 using conforming CVD techniques in which solutions having the reactive component 20 and precursors such as tetramethylcyclotetrasiloxane for CDO, silane for CDO, hexafluoropropylene oxide for poly(tetraluoroethylene), zirconium acetylacetonates (and other metal acetylacetonates) for high k dielectrics, or tetraethoxyhafniate (and other metal alkoxides) for high k dielectrics, are deposited over substrate 10 at a temperature in a range of approximately 150° C. to 400° C. and a pressure range of about 1 torr to 5 torr.

Dielectric layer 12 may be formed from low-k dielectric materials, such as low-k polymeric dielectrics or organic-containing silicon dioxide or carbon-doped oxide dielectric. Alternatively, dielectric layer 12 may be formed from a high-k gate dielectric material such as aluminum oxide ($Al_2O_3$), tantalum pentoxide ($Ta_2O_5$), hafnium pentoxide ($Hf_2O_5$), etc. In another embodiment, dielectric layer 12 may be formed from a high-k capacitor dielectric material such as $Ta_2O_5$, barium strontium titanate ($BaSrTiO_3$ or BST), etc. The formed dielectric layer practiced with this invention may be an inter layer dielectric (ILD) layer, an inter metal dielectric (IMD) layer, a premetal dielectric, or any type of dielectric layer used in the manufacture of integrated circuits. Typically, the formed dielectric layers are applied onto wafer substrates, which are to be processed into an integrated circuit (IC) or another microelectronic device. The wafer/substrate may or may not have a circuit pattern on its surface.

Reactive components 20 that may be used in this invention include, but are not limited to, components that contain a polar terminating group, a silicon —(Si—) containing group, or a phenolic group. By adding a reactive component 20 to the precursor solution 22, or alternatively onto formed dielectric layer 12 material that has non-polar bonds at one side and polar bonds at the other, surface polar groups or sites could be increased in a way that is analogous to forming phospho-lipid bi-layers and self-assembled micelles. The non-polar component of the reactive component 20 will be attracted to and embedded in the bulk of the organic polymer or organic-doped oxide. The polar groups will preferentially orient to the surface of the organic polymer or organic-doped oxide.

In one embodiment of the invention, reactive components 20 added to precursor solution 22 matrix, or alternatively onto formed dielectric layer 12, may include organosilanols and silanols such as trimethyl silanol, triphenyl silanol, etc. The organic portion of organosilanols and silanols provides the necessary solubility into the bulk of the organic polymer or organic-doped oxide while the polar Si—OH bonds would orient towards the surface to aid or enhance nucleation of subsequently deposited material layers, including for example nucleation of a barrier material layer. Stated another way, organosilanols with general chemical formula of —$(R_2Si)_n$OH, where R represents organic groups such as alkyls, aromatics, olefins, are one class of reactive component 20 molecules that can be added to the precursor solution 22 matrix, or alternatively onto formed dielectric layer 12. Since R (i.e., alkyls, aromatics, olefins) is compatible with the polymer interlayer dielectric matrix, —SiOH groups will tend to segregate at the surface and provide nucleation sites. Subsequent treatment with electron beam, or $O_2$, $N_2O$, $H_2$ plasma may be applied to further increase the surface SiOH.

In another embodiment, siloxanes —$(R_2SiO)$—$_n$) and organosilanes —$(R_2Si)$—$_n$, such as hexamethyl disiloxane, hexamethyl disilane, trimethyl silane, etc., may be added as reactive components 20 to the precursor solution 22, or alternatively onto formed dielectric layer 12, to form Si—OH groups during processing. Siloxanes and organosilanes can be readily converted to —Si—OH groups by processing/treating the formed dielectric layer 12 using a plasma treatment process, such as $O_2$, $N_2O$ or $H_2$ plasma treatment process (as detailed in the following section).

In another embodiment, organo-silicon halides with general formula of —$(R_2Si)_nX$(X=Cl, F, Br) may be added as reactive components 20 to the precursor solution 22, or alternatively onto formed dielectric layer 12, to form Si—OH groups during processing. Exposed Si—X groups are generally converted to Si—OH through reaction with moisture. In one embodiment, the reaction $(R_2Si)_nX+H2O \rightarrow (R_2Si)_n$—OH+HX may be performed using water vapor treatment at a pressure of above $10^{-6}$ torr and a temperature range from above room temperature to about 400° C. In an alternate embodiment, the reaction $(R_2Si)_nX+H2O \rightarrow (R_2Si)_n$—OH+HX may be performed by reacting with a basic solution (such as $NH_4OH$, KOH, NaOH) having a pH level of above 8 and at a temperature in a range of 25–100° C.

Creating or producing polar groups is not limited to using a reactive component 20 containing silicon molecules. For example, in another embodiment, a phenolic component may be added as a reactive component 20 to the precursor solution 22, or alternatively onto formed dielectric layer 12, to enhance barrier nucleation. The phenolic compounds refer to polymers having generally a structure of Ar—OH where Ar— represents aromatic polymers. In one exemplary embodiment, a layer of the phenolic polymers having a thickness in a range of about 10–100 Å may be deposited onto the surface of low k dielectric layer 12.

In yet another embodiment, a small amount of polarity could be added as side-chains in an organic polymer, eliminating the requirement to add a second component to the solution.

With reference to FIGS. 1 and 2b, as set forth in block 130 of chart 100 of FIG. 1, after of dielectric layer 12 having a reactive component 20 is formed on substrate 10, the method generally continues by processing/treating the formed dielectric layer 12 having the reactive component 20 to produce, generate or enhance the generation of polar groups or polar sites 30 at least on the surface 14 of the formed dielectric layer 12. Processing the formed dielectric layer 12 may be performed using a wet or dry chemical treatment process, a plasma treatment process, an electron beam treatment process, or other processes known in the art that produce or enhance the generation of, polar groups 30 or polar sites 30 at least on the surface 14 of the formed dielectric layer 12. The processed dielectric layer 12a has improved nucleation and/or adhesion properties or characteristics that advantageously benefit subsequently-deposited material layers, e.g. barrier material layers, ultimately leading to improved IC devices.

In one embodiment, processing the formed dielectric layer 12 with the reactive component 20 (process block 130 in FIG. 1) may be done by using a wet chemical treatment technique where the surface 14 of formed dielectric layer 12 is treated with an alkaline solution, for example potassium hydroxide (KOH) or sodium hydroxide (NaOH), to increase the number of Si—OH, C—OH, or C(O)—OH groups. Wet chemical treatment techniques are well known in the art and have been used, for example, for metallization of polyimide substrates.

In a second embodiment, processing the formed dielectric layer 12 with the reactive component 20 (process block 130 in FIG. 1) may be performed by treating, e.g. exposing, the surface 14 of the dielectric layer 12 to electron beam radiation under conditions sufficient to enhance nucleation. Dielectric layer 12 formed on substrate 10 may be treated with, e.g. exposed to electron beams in any deposition/processing chamber having a means for providing electron beam radiation to substrates placed therein. The number of Si—OH groups 30 on the surface of organosiloxanes is increased in a controlled fashion by varying the electron beam flux and energy. The increased polarity of the dielectric layer surface 14 should result in increased nucleation for a subsequently deposited metal barrier layer.

The chamber pressure during electron beam processing (block 130 of chart 100 in FIG. 1) may range from about 10 millitorr to about 50 torr. The chamber temperature during electron beam processing may range from about 35° C. to about 450° C., and preferably about 400° C. The time period of electron beam exposure will be dependent upon the strength of the beam dosage applied to the substrate and the beam current density. One of ordinary skill in the art can readily optimize the conditions of exposure to get the claimed results, but generally the exposure will range from about 1 minute to about 120 minutes, and preferably from an electron beam dose of about 10 to about 500 microcoulombs per square cm ($\mu C/cm^2$), preferably from about 20 to about 300 $\mu C/cm^2$. The accelerating voltage of the electron beam may range from about 0.5 to about 20 KeV, and preferably from about 3 KeV. The dose and accelerating voltage selected will be proportional to the degree and depth of the desired surface modification respectively. In one exemplary embodiment, a substrate 10 having a carbon doped oxide (CDO) dielectric layer 12 with a reactive component 20 formed thereon is processed in a chamber at a temperature of about 400° C., using an electron beam dose of about 20 $\mu C/cm^2$, where the acceleration voltage of the electron beam is about 3 KeV.

In a third embodiment, processing the formed dielectric layer 12, e.g. low-k polymeric dielectric layer, with the reactive component 20 (process block 130 in FIG. 1) may performed using a plasma treatment, e.g. $O_2$, $N_2O$, or $H_2$ plasma treatment, which are well known in the art. The $O_2$ and $N_2O$ plasmas could replace the C—H or Si—H bonds at the low-k dielectric layer surface 14 and generate Si—OH and C—OH groups 30, which is key for depositing metal or metallic compounds, such as TiN barrier, using ALD techniques. Using an $H_2$ plasma-based reactive pre-clean process on carbon-doped oxide (CDO) dielectric layer surface increases the Si—OH group at the surface by striping off hydrophobic groups (like methyl groups). The plasma treatment may be performed either in situ, e.g. in the same chamber used for deposition of thin dielectric layer 12, or alternatively in a system, or tool, other then the apparatus used for deposition of dielectric layer 12. In an exemplary plasma treatment process, the plasma treatment may be performed at a temperature ranging from about minus (−) 25° C. to about 425° C., at a pressure of about 0.1 to 20 torr, with an $O_2$, $N_2$ or $N_2O$ flow between about 100 to 2,000 standard liters per minute (SLM), at a power of about 10 to 3000 watts, at a frequency range of about 350 KHz to 2.45 GHz.

With reference now to FIGS. 1 and 2c, as set forth in block 140 of chart 100 of FIG. 1, following dielectric layer treatment, the method continues by forming another material layer 15, e.g. a barrier material layer 15, over the treated dielectric layer 12a having polar groups/polar site 30, e.g. Si—OH or C—OH groups 30 at least at the surface 14 of the treated dielectric layer 12a. Forming another material layer 15, e.g. barrier material layer 15, over the dielectric layer 12a is generally done using conforming CVD or ALD processes, or any deposition process known in the art.

Generally, ALD processes proceed by chemisorption at the deposition surface 14 of the treated dielectric layer 12a. The technique of ALD is based on the principle of the formation of a saturated monolayer of reactive precursor molecules by chemisorption. In an embodiment, barrier material layer 15 is formed by alternately introducing, e.g. pulsing, precursors over treated dielectric layer 12a into the ALD deposition chamber maintained at a process temperature in a range of approximately 150–400° C. and preferably about 350° C., and pressure of about 1–5 torr, preferably about 1 torr. Each introduction, e.g. injection pulse, of a precursor is separated by an inert gas purge, e.g. nitrogen ($N_2$) purge. Each precursor injection provides a new atomic layer additive to previous deposited layers to form a uniform layer of a solid film. The cycle is repeated until the desired barrier layer/film 15 thickness is reached.

In an exemplary barrier material ALD process, a titanium nitride (TiN) layer 15 is formed over the treated dielectric layer 12a by alternatively depositing TDMAT (tetradimethylaminotitanium) and $NH_3$ precursors over the treated dielectric layer 12a. The deposition rate of ALD TiN layer 15 is about 10 Å per minute. In an embodiment, the ALD process temperature and pressure are about 380° C. and 1 torr, respectively. One of ordinary skill in the art can readily modify the above processing conditions to get the claimed results. The thickness 16 of the TiN layer 15 formed may vary depending on the type of integrated circuit (IC) being manufactured, processing preferences, etc., but typically the thickness 16 may range from about 50 angstroms (Å) to about 1,000 Å and preferably about 10–100 Å.

Continuing with FIG. 1, next, the method continues by performing any remaining process steps needed to complete the IC fabrication (block 150 of chart 100 in FIG. 1). These steps may include but are not limited to forming, patterning, annealing, etc. of additionally formed conductive and insulating material layers, which are well known in the art.

Figure 3:
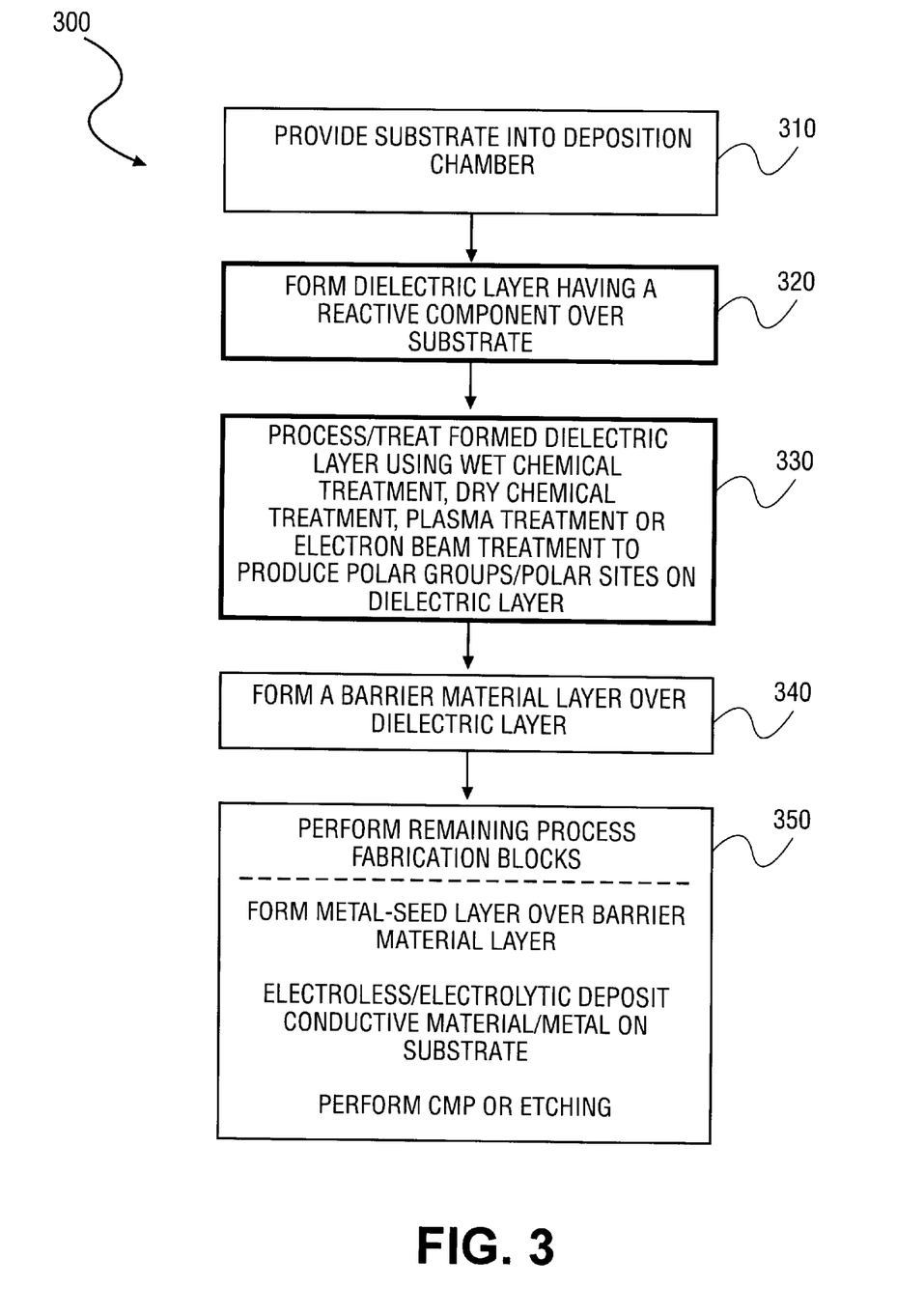
FIG. 3 is an embodiment of a process according to this invention to improve nucleation and adhesion of a film/layer, such as a barrier layer, deposited onto low-k dielectric layer of a copper damascene structure.

Turning now to FIG. 3 and FIGS. 4a–4d, an embodiment of a process according to this invention to improve nucleation and adhesion of a film/layer, such as a barrier layer, deposited onto low-k dielectric layer of a copper damascene structure is shown in FIG. 3, while FIGS. 4a–4d are schematic cross-sectional views illustrating a substrate processed according to the process embodiment shown in FIG. 3.

Figure 4A:
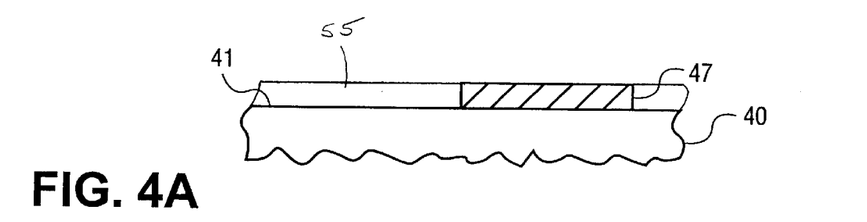
FIGS. 4a–4e are schematic cross-sectional views illustrating a substrate processed according to the process embodiment shown in FIG. 3.

With reference to FIG. 3 and FIG. 4a, in an embodiment of the present invention, an exemplary semiconductor substrate structure 40 having a previously deposited insulating dielectric layer 55 and an electrically-conductive pathway 47, for example a metallization structure or metallic line 47, on its surface 41 is provided into a deposition chamber (block 310 of chart 300 in FIG. 2). Metallic layer 47 is representative of one of the metal layers in a multiple metal level semiconductor device and may be manufactured of a copper metal, a copper alloy, or any other materials used in the art of metal interconnects. Dielectric layer 55 may be a low-k dielectric material layer, a high k dielectric material layer, or combinations thereof. Dielectric layer 55 may have an etch stop/diffusion barrier layer (not shown), such as a silicon nitride or silicon carbide layer on its top or upper surface. Suitable substrate materials for the present invention include, but are not limited to, low-k dielectric materials such as low-k polymeric dielectrics or organic-containing silicon dioxide or carbon-doped oxide (CDO) dielectric. Other substrate materials, such as silicon and compositions containing silicon, and other substrate materials known in the art of IC manufacture are also within the scope of this invention.

As discussed above, although in this embodiment, substrate 40 has a metalization structure 47 thereon, it should be noted that when practicing this invention, the wafer/substrate may or may not have a metalization structure, e.g. circuit pattern, on its surface.

Figure 4B:
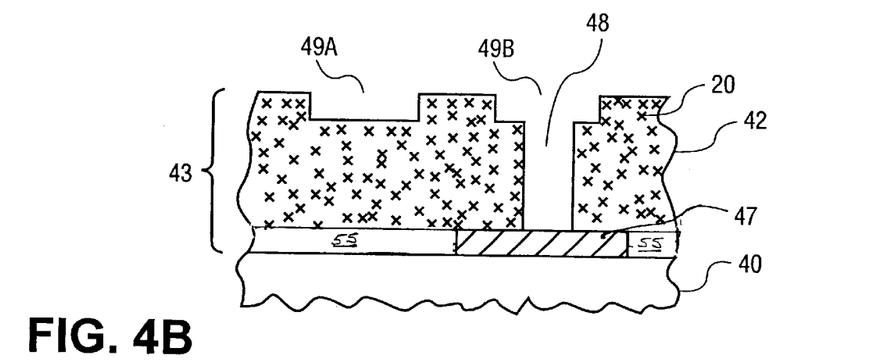

With reference to FIG. 3 and FIG. 4b, according to an embodiment of this invention, with the substrate 40 in the deposition chamber, a dielectric layer 42 having a reactive component 20 therewith is formed over substrate 40, dielectric layer 55, and the metalization structure 47 (block 320 of chart 300 in FIG. 3). Reactive component 20 may include any component that produces or enhances the generation of polar groups or polar sites on the formed dielectric layer 42. As discussed above, the reactive component 20 may be added to a precursor solution used in forming the dielectric layer 42. The precursor solution with the reactive component 20 is then deposited over substrate 40 using a CVD process, an ALD process, or other suitable deposition processes known in the art. Alternatively, reactive component 20 may be deposited onto the formed dielectric layer 42 and thus not added to the precursor matrix used to form dielectric layer 42.

In one embodiment of the invention, reactive components 20 may include organosilanols and silanols such as trimethyl silanol, triphenyl silanol, etc. The organic portion of organosilanols and silanols provides the necessary solubility into the bulk of the organic polymer or organic-doped oxide while the polar Si—OH bonds would orient towards the surface to aid or enhance nucleation of subsequently deposited material layers, including for example nucleation of a barrier material layer. In another embodiment, siloxanes and organosilanes such as hexamethyl disiloxane, hexamethyl disilane, trimethyl silane, etc., may be added as reactive components 20 to the precursor solution to form Si—OH groups during processing. In yet another embodiment, organo-silicon halides with general formula of —$(R_2Si)_nX$ (X=Cl, F, Br) may be added as reactive components 20 to the precursor solution to form Si—OH groups during processing. In another embodiment, a phenolic component may be added as a reactive component 20 to the precursor solution to enhance barrier nucleation. In yet another embodiment, a small amount of polarity could be added as side-chains in an organic polymer, eliminating the requirement to add a second component to the solution.

Dielectric layer 42 formed over substrate 40 is deposited using conforming CVD or ALD techniques as previously discussed above for forming dielectric layer 12. Dielectric layer 42 may be formed from low-k dielectric materials, such as low-k polymeric dielectrics or organic-containing silicon dioxide or carbon-doped oxide dielectric. As stated above, for alternative IC device embodiments, dielectric layer 42 may be formed from a high-k gate dielectric material such as aluminum oxide ($Al_2O_3$), tantalum pentoxide ($Ta_2O_5$), hafnium pentoxide ($Hf_2O_5$), etc. In another embodiment, dielectric layer 42 may be formed from a high-k capacitor dielectric material such as $Ta_2O_5$, barium strontium titanate ($BaSrTiO_3$ or BST), etc. The thickness 43 of the formed inter metal dielectric layer/film 42 may vary depending on the type of integrated circuit (IC) being manufactured, processing preferences, etc., but typically the thickness 43 may range from about 500 angstroms (Å) to about 50,000 Å and preferably about 2,000–20,000 Å.

It is understood that structure 40 is only a portion of many structures present on a semiconductor wafer. In the embodiment shown in FIG. 4b, trenches 49a and 49b are patterned in structure 40, and specifically in the formed dielectric layer 42 using well known techniques such as etching. A via opening 48 is also patterned in the dielectric layer 42 under trench 49b for interconnection to the lower metal layer 47. Structure 40 or similar can be fabricated utilizing single or dual damascene processes known in the art.

Figure 4C:
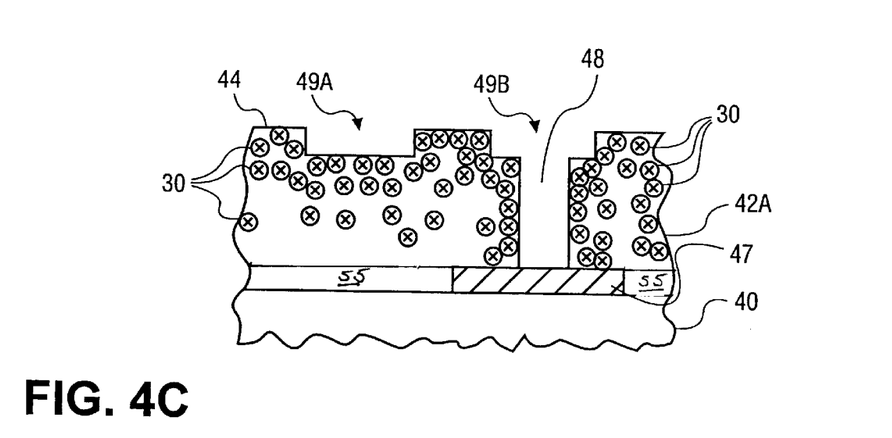

With reference to FIGS. 3 and 4c, as set forth in block 330 of chart 300 of FIG. 3, after of dielectric layer 42 having a reactive component 20 is formed and patterned on substrate 40, the method generally continues by processing the formed dielectric layer 42 having the reactive component 20 to produce, generate or enhance the generation of polar groups or polar sites 30 at least on the surface 44 of the formed dielectric layer 42. Processing the formed dielectric layer 42 may be performed using a wet or dry chemical treatment process, an electron beam treatment process, or a plasma treatment process as discussed in detail above. The treated dielectric layer 42a has improved nucleation and/or adhesion properties or characteristics that advantageously benefit subsequently-deposited material layers, e.g. barrier material layers, ultimately leading to improved IC devices.

Figure 4D:
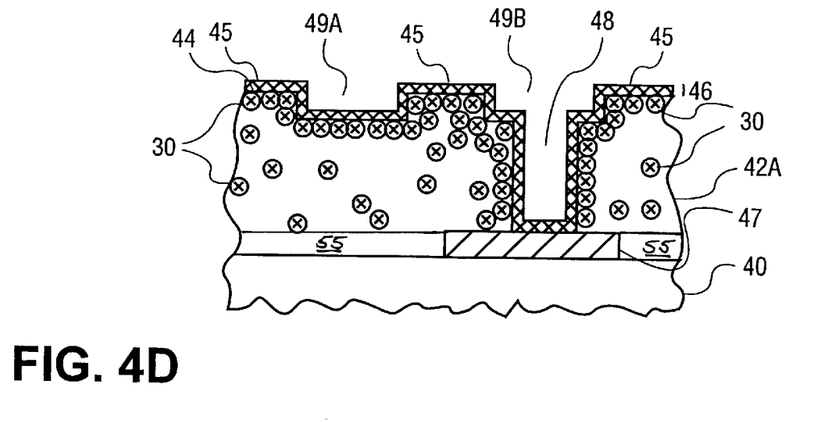

With reference now to FIGS. 3 and 4d, in an exemplary dual damascene process, as set forth in block 340 of chart 300 of FIG. 3, following dielectric layer treatment, the method continues by forming another material layer 45, e.g. a barrier material layer 45, over the treated dielectric layer 42a having polar groups/polar site 30, e.g. Si—OH or C—OH groups 30 at least at the surface 44 of the treated dielectric layer 42a. Barrier layer 45 is formed not only over the treated dielectric layer 42a but also in the trench openings 49a, 49b and via opening 48 so that the barrier layer 45 overlies the ILD layer 42 and lines the inside of the trenches 49a, 49b and via 48 (as illustrated in FIG. 4d). Barrier layers, such as barrier layer 45, are typically used with metal interconnect material to optimize performance of the metal interconnects and to prevent diffusion of the metal interconnect material into the substrate.

Barrier layer 45 may be formed of tantalum (Ta), tantalum nitride (TaN), titanium (Ti), titanium nitride (TiN), tungsten nitride (WN), tungsten-tantalum (WTa), tantalum silicon nitride, or other ternary compounds. However, it is appreciated that other materials can be used for barrier layer 45 in the practice of the present invention. The barrier layer 45 is formed using known film deposition techniques, such as CVD and ALD discussed in detail above. Barrier layer 45 may also be formed using physical vapor deposition, electrolytic plating, or electroless plating techniques.

In an exemplary barrier material ALD process, a titanium nitride (TiN) layer 45 is formed over the treated dielectric layer 42a by alternatively depositing TDMAT (tetradimethylaminotitanium) and $NH_3$ precursors over the treated dielectric layer 42a. The deposition rate of ALD TiN layer 45 is about 10 Å per minute. In an embodiment, the ALD process temperature and pressure are about 380° C. and 1 torr, respectively. One of ordinary skill in the art can readily modify the above processing conditions to get the claimed results. The thickness 46 of the TiN layer 45 formed may vary depending on the type of integrated circuit (IC) being manufactured, processing preferences, etc., but typically the thickness 46 may range from about 50 angstroms (Å) to about 1,000 Å and preferably about 10–100 Å.

Figure 4E:
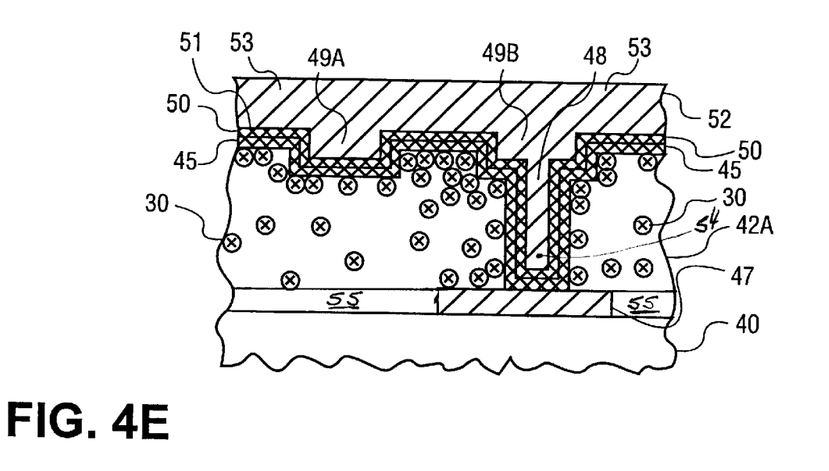

With reference to FIGS. 3 and 4e, as set forth in block 350 of chart 300 in FIG. 3, next, the exemplary dual damascene metallization process continues by performing remaining fabrication blocks. The process typically may include forming a metal seed layer 50, such as a copper-seed layer 50, over the barrier layer 45 that overlies the treated ILD layer 42a and lines the inside of the trenches 49a, 49b and via 48. Metal seed layer 50 may be deposited or formed using metals, metal alloys, metal compounds, multiple layers of metal stack or any substrates where a metal that is to be used to form the interconnects in the trench and the via can nucleate and grow. Generally, the metal seed layer 50 is made of a metal or metal alloy and may include, but is not limited to, copper, copper alloy, nickel, silver, gold, and cobalt.

The metal seed layer 50 may be deposited/formed using a directional deposition technique. Directional deposition techniques, which are known in the art, include collimated sputtering, plasma enhanced chemical vapor deposition, and ionized physical vapor deposition with or without bias voltage. Generally, seed layer 50 is deposited to a thickness in the range of approximately 1000–3000 Å. In an embodiment, seed layer 50 is deposited to a thickness of about 2000 Å.

Continuing with reference to FIGS. 3 and 4e, the process continues by electrolytic/electroless plating of a conductive material on substrate 40. Prior to electrolytic/electroless plating of a conductive material, however, the metal seed layer 50 is generally physical or chemical treated to form a passivation layer (not shown) on substrate 40. The substrate 40 having a passivation layer (not shown) formed over the barrier layer 50 is then thermally annealed to eliminate the passivation layer and any other contaminants accumulated on the surface of the substrate. Passivating the metal seed layer 50 may be done in-situ or ex-situ using liquid media such as acids, bases, solvents, and di-ionized water, or may be done using a chemically active or inert gas, such as argon (Ar), helium (He), oxygen ($O_2$), hydrogen ($H_2$), $H_2$ and He, $H_2$ and nitrogen ($N_2$), $H_2$ and Ar, etc. at a range of temperatures and concentrations known in the art. Generally, annealing the metal seed layer 50 having a passivating layer (not shown) thereon is done by flowing forming gas comprising 95%/5% $N_2$ to $H_2$ into a seed anneal chamber or alike at a temperature of about 250° C. for about 30 seconds and then cooling the substrate in forming gas at a temperature of about 15–20° C. for about 25 seconds. In one embodiment, $N_2$ is provided into the anneal chamber at a flow rate of about 19 standard liters per minute (slm), while $H_2$ is provided into the anneal chamber at a flow rate of about 1 slm.

Following the metal seed anneal procedure, the process continues by performing electroless or electrolytic plating of substrate structure 40 to deposit a conductive material 52, e.g. metal or alloy, into trenches 49a, 49b, via 48 and overburden 53 of the substrate structure 40 (block 350 of chart 300 in FIG. 3). The deposited conductive material will form a metal interconnect 54 for interconnection to the lower metal layer 47. Electroless and electrolytic plating processes that may be used to form metal interconnect 54 are known in the art. Electrolytic plating includes deposition of metal from an electrolyte solution by cathodic reduction. Electroless plating includes deposition of metal from the electrolyte by chemical reduction. The reducing agent (e.g. Red) in the electrolyte is the source of the electrons. Electrolytic- or electroless-depositing a conductive material into trenches 49a, 49b, via 48 and overburden 53 of the substrate structure 40 to form a metal interconnect may be done using a solution of copper sulfate (resulting in a copper plating), silver nitrate (resulting in a silver plating) or gold cyanide (resulting in a gold plating).

By way of example, in an electroless copper plating process, the substrate structure/wafer 40 is exposed to a first plating solution by means such as immersion of the substrate structure/wafer 40 into a plating bath, or by spraying the plating solution onto the structure/wafer 40. The first plating solution is an aqueous solution of an acid such as hydrofluoric acid or sulfuric acid, and a metal salt or complex that is soluble in the acid used. A redox reaction occurs between the metal ions in the solution, e.g., cupric ions ($Cu^{2+}$) and a reducing agent leading to reduction of the metal ions and subsequent plating onto the copper seed layer 50. The reaction typically proceeds at room temperature for a period of time until the conductive interconnect/level is formed. Time and temperature may be adjusted as necessary to affect the rate of the reaction, and is known in the art.

Following electroless or electrolytic plating of substrate structure 40, a chemical-mechanical polishing (CMP) process or a chemical etch removal process may be performed. CMP or chemical etch removal polishes away or removes the excess metal, e.g. copper, metal-seed material, and barrier layer material above the ILD layer 42a, so that the only copper and barrier layer material left will be in trenches 49a, 49b and via 48.

A method to improve nucleation and adhesion of a CVD and ALD-deposited film/layer, such as barrier layer, onto a low dielectric-constant dielectric material layer has been described. Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method comprising:

forming a dielectric layer over a substrate, the dielectric layer including a reactive component;

processing the reactive component in the dielectric layer to produce polar groups or polar sites preferentially oriented to a surface of the dielectric layer, the polar groups or polar sites to enhance nucleation and adhesion properties along the surface of the dielectric layer to deposit an overlying conductive material; and depositing the overlying conductive material on the surface of the dielectric layer.

2. The method of claim 1, wherein forming the dielectric layer includes depositing a dielectric material having the reactive component therewith using a chemical vapor deposition process or an atomic layer deposition process.

3. The method of claim, 1 wherein forming the dielectric layer includes adding a precursor solution to introduce the reactive component when forming the dielectric layer using chemical vapor deposition or atomic layer deposition.

4. The method of claim 1 wherein processing the dielectric layer includes treating the dielectric layer by wet chemical treatment, dry chemical treatment, plasma treatment or electron beam treatment.

5. The method of claim 1, wherein the reactive component is selected from the group consisting of organosilanols, silanols, organo-silicon halides, siloxanes, organosilanes and phenols.

6. The method of claim 1, wherein the reactive component is selected from the group consisting of trimethyl silanol, triphenyl silanol, hexamethyl disiloxane, hexamethyl disilane and trimethyl silane.

7. The method of claim 1, wherein the dielectric layer comprises material selected from the group consisting of organic polymer dielectric material having a low dielectric constant, organic-doped oxide dielectric material and high dielectric constant dielectric material.

8. The method of claim 1, wherein processing the dielectric layer includes using a wet chemical treatment using an alkaline solution selected from the group consisting of potassium hydroxide and sodium hydroxide.

9. The method of claim 1, wherein processing the dielectric layer includes using an electron beam treatment which exposes the surface of the dielectric layer to an electron beam radiation dose of approximately 10–500 microcoulombs per square centimeter at a temperature in a range of approximately 35–450° C., the electron beam having an electron beam accelerating voltage in a range of approximately 0.5–20 KeV.

10. The method of claim 1, wherein processing the dielectric layer includes using a plasma treatment which is performed in an oxygen, nitrogen or $N_2O$ ambient flowing into the chamber at a flow rate of approximately 100 to 2,000 standard liters per minute, at a temperature in a range of approximately minus 25 to about 425° C., at a pressure of approximately 0.1 to 20 torr, at a power of approximately 100 to 3000 watts, at a frequency range of approximately 350 KHz to 2.45 GHz.

11. The method of claim 1, wherein depositing the overlying conductive material deposits a barrier layer.

12. The method of claim 1, wherein forming the dielectric layer includes depositing a dielectric material selected from the group consisting of organic polymer dielectric, organic-doped oxide dielectric, aluminum oxide, tantalum pentoxide, hafnium pentoxide and barium strontium titanate.

13. The method of claim 1, wherein depositing the overlying conductive material deposits a barrier layer using chemical vapor deposition or atomic layer deposition.

14. A method comprising:

forming a low k dielectric layer having a reactive component therewith over a substrate processing the reactive component in the low k dielectric layer to produce polar groups or polar sites preferentially oriented to a surface of the low k dielectric layer, the polar groups or polar sites to enhance nucleation and adhesion properties along the surface of the low k dielectric layer to deposit an overlying barrier layer of metallic material; and depositing the overlying barrier layer onto the surface of the low k dielectric layer.

15. The method of claim 14, wherein the reactive component is selected from the group consisting of organosilanols, silanols, organo-silicon halides, siloxanes, organosilanes and phenols.

16. The method of claim 14, wherein the low k dielectric layer comprises material selected from the group consisting of organic polymer dielectric material having a low dielectric constant, organic-doped oxide dielectric material and high dielectric constant dielectric material.

* * * * *